(12) United States Patent
Keelan et al.

(10) Patent No.: US 9,881,951 B2
(45) Date of Patent: Jan. 30, 2018

(54) IMAGE SENSORS WITH PHASE DETECTION PIXELS

(71) Applicant: SEMICONDUCTOR COMPONENTS INDUSTRIES, LLC, Phoenix, AZ (US)

(72) Inventors: Brian Keelan, Boulder Creek, CA (US); Marko Mlinar, Horjul (SI); Douglas Fettig, Meridian, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/245,971

(22) Filed: Aug. 24, 2016

(65) Prior Publication Data

US 2016/0365373 A1    Dec. 15, 2016

Related U.S. Application Data

(63) Continuation of application No. 14/614,104, filed on Feb. 4, 2015, now Pat. No. 9,455,285.

(51) Int. Cl.

| | |
|---|---|
| *H04N 5/232* | (2006.01) |
| *H01L 27/146* | (2006.01) |
| *H04N 5/225* | (2006.01) |
| *H04N 5/357* | (2011.01) |
| *H04N 9/04* | (2006.01) |
| *H04N 9/077* | (2006.01) |

(Continued)

(52) U.S. Cl.
CPC .. *H01L 27/14605* (2013.01); *H01L 27/14607* (2013.01); *H01L 27/14621* (2013.01); *H01L 27/14627* (2013.01); *H01L 27/14643* (2013.01); *H04N 5/2257* (2013.01); *H04N 5/23212* (2013.01); *H04N 5/357* (2013.01); *H04N 5/359* (2013.01); *H04N 5/3696* (2013.01); *H04N 9/045* (2013.01); *H04N 9/077* (2013.01); *H04N 2209/045* (2013.01)

(58) Field of Classification Search
None
See application file for complete search history.

(56) References Cited

U.S. PATENT DOCUMENTS

| | | | |
|---|---|---|---|
| 2012/0193515 A1* | 8/2012 | Agranov | G01S 3/782 250/208.1 |
| 2013/0038691 A1 | 2/2013 | Agranov et al. | |

(Continued)

*Primary Examiner* — Stephen Coleman
(74) *Attorney, Agent, or Firm* — Treyz Law Group, P.C.; Joseph F. Guihan

(57) ABSTRACT

An image sensor may include an image pixel array with both image pixels to gather image data and phase detection pixels to gather phase information. The phase detection pixels may be arranged in pairs, with two adjacent pixels covered by a single microlens. The phase detection pixel pairs may be arranged in dashed lines, with image pixels interposed between each phase detection pixel pair. There may be only one image pixel interposed between each phase detection pixel pair. The phase detection pixels may all include color filter elements of the same color. The phase detection pixels may all include green color filter elements. The image pixels in the interrupted lines may include color filter elements that match the surrounding color pattern. The image pixels in the interrupted lines may all include color filter elements of the same color.

19 Claims, 7 Drawing Sheets

(51) Int. Cl.
  *H04N 5/359* (2011.01)
  *H04N 5/369* (2011.01)

(56) References Cited

U.S. PATENT DOCUMENTS

| | | |
|---|---|---|
| 2013/0088621 A1 | 4/2013 | Hamada |
| 2014/0146201 A1* | 5/2014 | Knight .................... H04N 9/04 348/231.99 |
| 2015/0085178 A1* | 3/2015 | Aoki .................. H04N 5/23212 348/349 |
| 2015/0381869 A1 | 12/2015 | Mlinar |

* cited by examiner

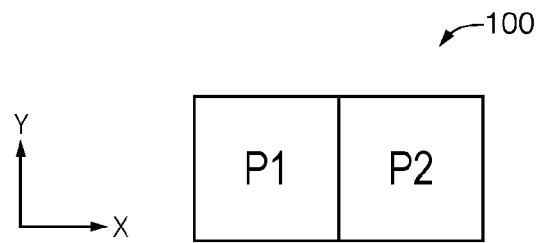
FIG. 4A
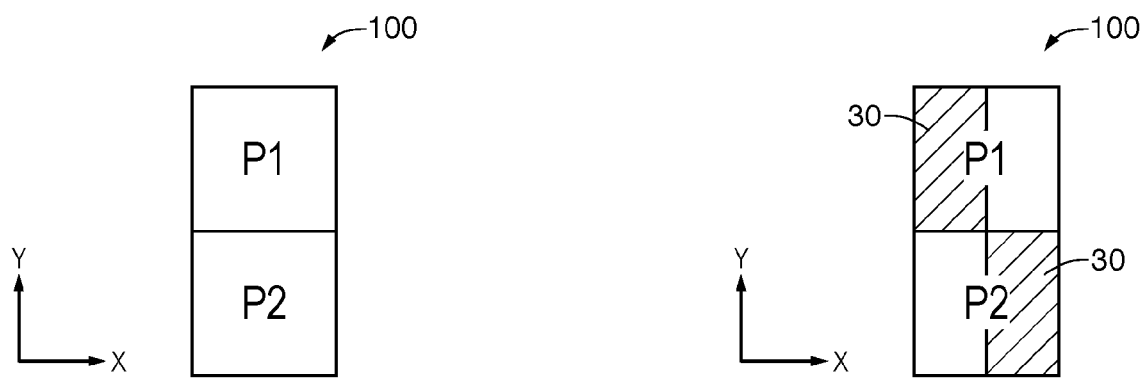
FIG. 4B
FIG. 4C
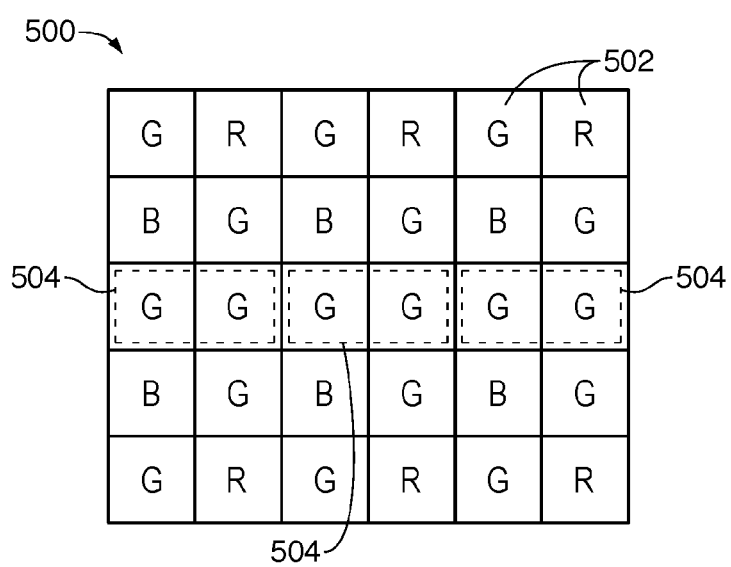
FIG. 5
(PRIOR ART)

FIG. 8

FIG. 9

# IMAGE SENSORS WITH PHASE DETECTION PIXELS

This application is a continuation of patent application Ser. No. 14/614,104, filed Feb. 4, 2015, which is hereby incorporated by reference herein in its entirety. This application claims the benefit of and claims priority to patent application Ser. No. 14/614,104, filed Feb. 4, 2015.

BACKGROUND

This relates generally to imaging systems and, more particularly, to imaging systems with phase detection capabilities.

Modern electronic devices such as cellular telephones, cameras, and computers often use digital image sensors. Imager sensors (sometimes referred to as imagers) may be formed from a two-dimensional array of image sensing pixels. Each pixel receives incident photons (light) and converts the photons into electrical signals. Image sensors are sometimes designed to provide images to electronic devices using a Joint Photographic Experts Group (JPEG) format.

Some applications such as automatic focusing and three-dimensional (3D) imaging may require electronic devices to provide stereo and/or depth sensing capabilities. For example, to bring an object of interest into focus for an image capture, an electronic device may need to identify the distances between the electronic device and object of interest. To identify distances, conventional electronic devices use complex arrangements. Some arrangements require the use of multiple image sensors and camera lenses that capture images from various viewpoints. Other arrangements require the addition of lenticular arrays that focus incident light on sub-regions of a two-dimensional pixel array. Due to the addition of components such as additional image sensors or complex lens arrays, these arrangements lead to reduced spatial resolution, increased cost, and increased complexity.

Some electronic devices include both image pixels and phase detection pixels in a single image sensor. With this type of arrangement, a camera can use the on-chip phase detection pixels to focus an image without requiring a separate phase detection sensor. In a typical arrangement, phase detection pixels all have the same color and are arranged consecutively in a line in the pixel array. When phase detection pixels are arranged in this way, optical crosstalk becomes problematic. For example, optical crosstalk from a phase detection pixel into an adjacent normal image pixel may not match the crosstalk that would have occurred from the standard image pixel that would have occupied the phase detection pixel position. This could be due to the phase detection having a different microlens shape or the phase detection pixel being a different color from the normal color of a standard image pixel at that position. This arrangement also prevents the image sensor from obtaining the data that would be generated by standard image pixels. Compensating for the missing image pixel data can be difficult and can result in visual artifacts in the processed image.

It would therefore be desirable to be able to provide improved phase detection pixel arrangements for image sensors.

BRIEF DESCRIPTION OF THE DRAWINGS

FIG. 4A is a top view of an illustrative phase detection pixel pair arranged horizontally in accordance with an embodiment of the present invention.

FIG. 4B is a top view of an illustrative phase detection pixel pair arranged vertically in accordance with an embodiment of the present invention.

FIG. 4C is a top view of an illustrative phase detection pixel pair arranged vertically and configured to detect phase differences along the horizontal direction (e.g., across vertical edges) in accordance with an embodiment of the present invention.

FIG. 5 is a top view of a conventional pixel array having phase detection pixels arranged consecutively in a line and all having the same color.

FIG. 8 is a top view of a pixel array having phase detection pixel pairs arranged in a dashed line with a single image pixel in between the phase detection pixel pairs in accordance with an embodiment of the present invention.

FIG. 9 is a top view of a pixel array having phase detection pixel pairs arranged consecutively in a line with the phase detection pixel pairs alternating between two colors in accordance with an embodiment of the present invention.

DETAILED DESCRIPTION

Figure 1:
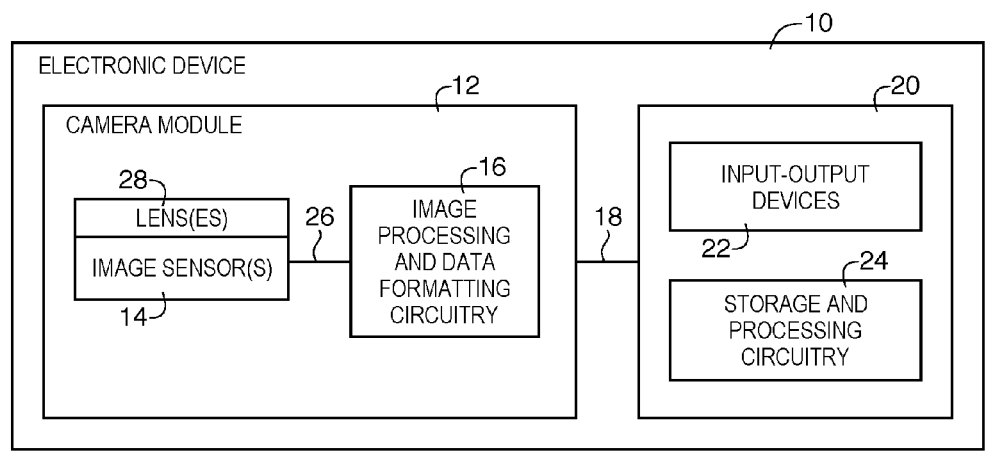
FIG. 1 is a schematic diagram of an illustrative electronic device with an image sensor that may include phase detection pixels in accordance with an embodiment of the present invention.

Embodiments of the present invention relate to image sensors with automatic focusing and depth sensing capabilities. An electronic device with a camera module is shown in FIG. 1. Electronic device 10 may be a digital camera, a computer, a cellular telephone, a medical device, or other electronic device. Camera module 12 (sometimes referred to as an imaging device) may include one or more image sensors 14 and one or more lenses 28. During operation, lenses 28 (sometimes referred to as optics 28) focus light onto image sensor 14. Image sensor 14 includes photosensitive elements (e.g., pixels) that convert the light into digital data. Image sensors may have any number of pixels (e.g., hundreds, thousands, millions, or more). A typical image sensor may, for example, have millions of pixels (e.g., megapixels). As examples, image sensor 14 may include bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Still and video image data from image sensor 14 may be provided to image processing and data formatting circuitry 16. Image processing and data formatting circuitry 16 may be used to perform image processing functions such as automatic focusing functions, depth sensing, data formatting, adjusting white balance and exposure, implementing video image stabilization, face detection, etc. For example, during automatic focusing operations, image processing and data formatting circuitry 16 may process data gathered by phase detection pixels in image sensor 14 to determine the magnitude and direction of lens movement (e.g., movement of lens 28) needed to bring an object of interest into focus.

Image processing and data formatting circuitry 16 may also be used to compress raw camera image files if desired (e.g., to Joint Photographic Experts Group or JPEG format). In a typical arrangement, which is sometimes referred to as a system on chip (SOC) arrangement, camera sensor 14 and image processing and data formatting circuitry 16 are implemented on a common integrated circuit. The use of a single integrated circuit to implement camera sensor 14 and image processing and data formatting circuitry 16 can help to reduce costs. This is, however, merely illustrative. If desired, camera sensor 14 and image processing and data formatting circuitry 16 may be implemented using separate integrated circuits.

Camera module 12 may convey acquired image data to host subsystems 20 over path 18 (e.g., image processing and data formatting circuitry 16 may convey image data to subsystems 20). Electronic device 10 typically provides a user with numerous high-level functions. In a computer or advanced cellular telephone, for example, a user may be provided with the ability to run user applications. To implement these functions, host subsystem 20 of electronic device 10 may include storage and processing circuitry 24 and input-output devices 22 such as keypads, input-output ports, joysticks, and displays. Storage and processing circuitry 24 may include volatile and nonvolatile memory (e.g., random-access memory, flash memory, hard drives, solid state drives, etc.). Storage and processing circuitry 24 may also include microprocessors, microcontrollers, digital signal processors, application specific integrated circuits, or other processing circuits.

It may be desirable to provide image sensors with depth sensing capabilities (e.g., to use in automatic focusing applications, 3D imaging applications such as machine vision applications, etc.). To provide depth sensing capabilities, image sensor 14 may include phase detection pixel groups such as pixel pair 100 shown in FIG. 2A.

Figure 2A:
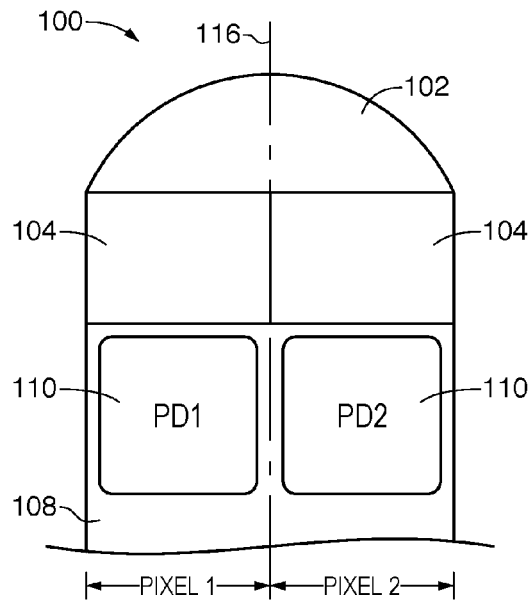
FIG. 2A is a cross-sectional view of illustrative phase detection pixels having photosensitive regions with different and asymmetric angular responses in accordance with an embodiment of the present invention.

FIG. 2A is an illustrative cross-sectional view of pixel pair 100. Pixel pair 100 may include first and second pixels such as Pixel 1 and Pixel 2. Pixel 1 and Pixel 2 may include photosensitive regions 110 formed in a substrate such as silicon substrate 108. For example, Pixel 1 may include an associated photosensitive region such as photodiode PD1, and Pixel 2 may include an associated photosensitive region such as photodiode PD2. A microlens may be formed over photodiodes PD1 and PD2 and may be used to direct incident light towards photodiodes PD1 and PD2. The arrangement of FIG. 2A in which microlens 102 covers two pixel regions may sometimes be referred to as a 2×1 or 1×2 arrangement because there are two phase detection pixels arranged consecutively in a line. Microlens 102 may have a width and a length, with the length being longer than the width. Microlens 102 may have a length that is about twice as long as its width. Microlens 102 may be in the shape of an ellipse with an aspect ratio of about 2:1. In other embodiments, microlens 102 may be another shape such as a rectangle or another desired shape. Microlens 102 may have an aspect ratio of less than 2:1, 2:1, greater than 2:1, greater than 3:1, or any other desired aspect ratio.

Color filters such as color filter elements 104 may be interposed between microlens 102 and substrate 108. Color filter elements 104 may filter incident light by only allowing predetermined wavelengths to pass through color filter elements 104 (e.g., color filter 104 may only be transparent to the certain ranges of wavelengths). Photodiodes PD1 and PD2 may serve to absorb incident light focused by microlens 102 and produce pixel signals that correspond to the amount of incident light absorbed.

Photodiodes PD1 and PD2 may each cover approximately half of the substrate area under microlens 102 (as an example). By only covering half of the substrate area, each photosensitive region may be provided with an asymmetric angular response (e.g., photodiode PD1 may produce different image signals based on the angle at which incident light reaches pixel pair 100). The angle at which incident light reaches pixel pair 100 relative to a normal axis 116 (i.e., the angle at which incident light strikes microlens 102 relative to the optical axis 116 of lens 102) may be herein referred to as the incident angle or angle of incidence.

An image sensor can be formed using front side illumination imager arrangements (e.g., when circuitry such as metal interconnect circuitry is interposed between the microlens and photosensitive regions) or back side illumination imager arrangements (e.g., when photosensitive regions are interposed between the microlens and the metal interconnect circuitry). The example of FIGS. 2A, 2B, and 2C in which pixels 1 and 2 are backside illuminated image sensor pixels is merely illustrative. If desired, pixels 1 and 2 may be front side illuminated image sensor pixels. Arrangements in which pixels are backside illuminated image sensor pixels are sometimes described herein as an example.

Figure 2B:
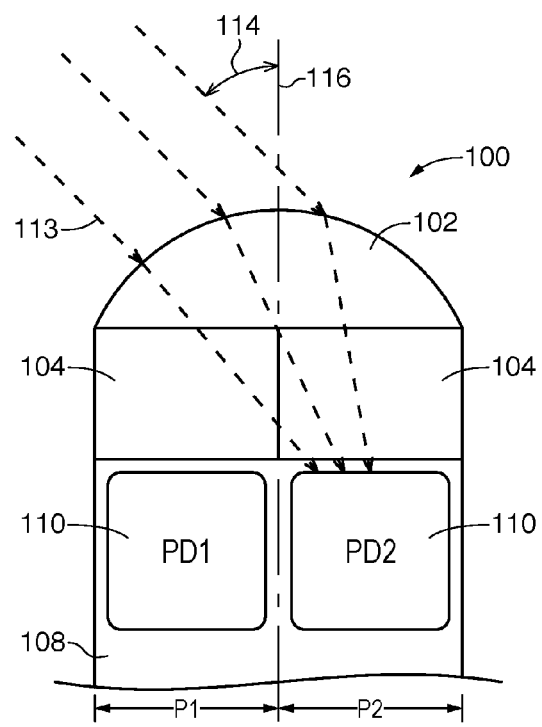
FIGS. 2B and 2C are cross-sectional views of the phase detection pixels of FIG. 2A in accordance with an embodiment of the present invention.

In the example of FIG. 2B, incident light 113 may originate from the left of normal axis 116 and may reach pixel pair 100 with an angle 114 relative to normal axis 116. Angle 114 may be a negative angle of incident light. Incident light 113 that reaches microlens 102 at a negative angle such as angle 114 may be focused towards photodiode PD2. In this scenario, photodiode PD2 may produce relatively high image signals, whereas photodiode PD1 may produce relatively low image signals (e.g., because incident light 113 is not focused towards photodiode PD1).

Figure 2C:
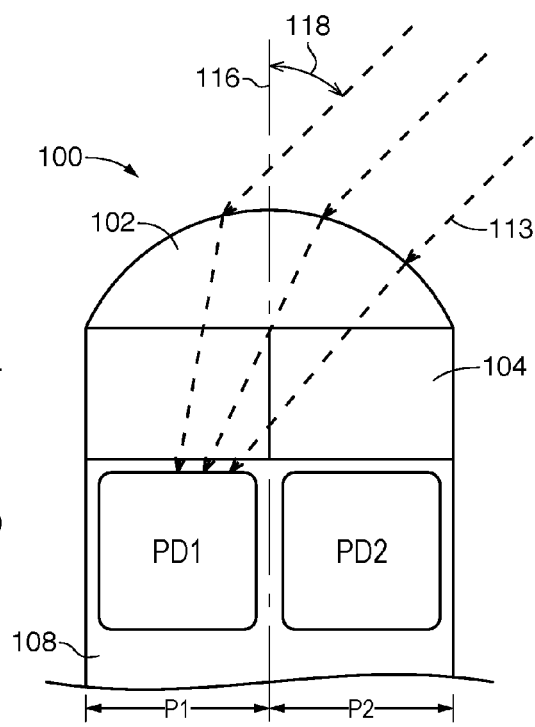

In the example of FIG. 2C, incident light 113 may originate from the right of normal axis 116 and reach pixel pair 100 with an angle 118 relative to normal axis 116. Angle 118 may be a positive angle of incident light. Incident light that reaches microlens 102 at a positive angle such as angle 118 may be focused towards photodiode PD1 (e.g., the light is not focused towards photodiode PD2). In this scenario, photodiode PD2 may produce an image signal output that is relatively low, whereas photodiode PD1 may produce an image signal output that is relatively high.

Figure 3:
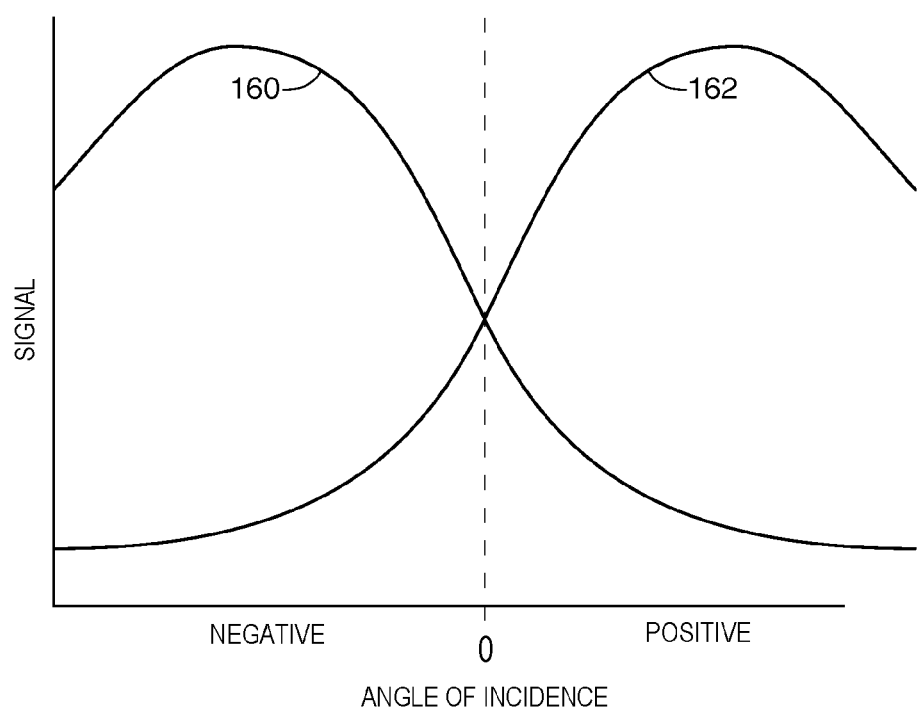
FIG. 3 is a diagram of illustrative signal outputs of phase detection pixels for incident light striking the phase detection pixels at varying angles of incidence in accordance with an embodiment of the present invention.

The positions of photodiodes PD1 and PD2 may sometimes be referred to as asymmetric positions because the center of each photosensitive area 110 is offset from (i.e., not aligned with) optical axis 116 of microlens 102. Due to the asymmetric formation of individual photodiodes PD1 and PD2 in substrate 108, each photosensitive area 110 may have an asymmetric angular response (e.g., the signal output produced by each photodiode 110 in response to incident light with a given intensity may vary based on an angle of incidence). In the diagram of FIG. 3, an example of the pixel signal outputs of photodiodes PD1 and PD2 of pixel pair 100 in response to varying angles of incident light is shown.

Line 160 may represent the output image signal for photodiode PD2 whereas line 162 may represent the output image signal for photodiode PD1. For negative angles of incidence, the output image signal for photodiode PD2 may increase (e.g., because incident light is focused onto photodiode PD2) and the output image signal for photodiode PD1 may decrease (e.g., because incident light is focused away from photodiode PD1). For positive angles of incidence, the output image signal for photodiode PD2 may be relatively small and the output image signal for photodiode PD1 may be relatively large.

The size and location of photodiodes PD1 and PD2 of pixel pair 100 of FIGS. 2A, 2B, and 2C are merely illustrative. If desired, the edges of photodiodes PD1 and PD2 may be located at the center of pixel pair 100 or may be shifted slightly away from the center of pixel pair 100 in any direction. If desired, photodiodes 110 may be decreased in size to cover less than half of the pixel area.

Output signals from pixel pairs such as pixel pair 100 may be used to adjust the optics (e.g., one or more lenses such as lenses 28 of FIG. 1) in camera module 12 during automatic focusing operations. The direction and magnitude of lens movement needed to bring an object of interest into focus may be determined based on the output signals from pixel pairs 100.

For example, by creating pairs of pixels that are sensitive to light from one side of the lens or the other, a phase difference can be determined. This phase difference may be used to determine both how far and in which direction the image sensor optics should be adjusted to bring the object of interest into focus.

When an object is in focus, light from both sides of the image sensor optics converges to create a focused image. When an object is out of focus, the images projected by two sides of the optics do not overlap because they are out of phase with one another. By creating pairs of pixels where each pixel is sensitive to light from one side of the lens or the other, a phase difference can be determined. This phase difference may be used to determine the direction and magnitude of optics movement needed to bring the images into phase and thereby focus the object of interest. Pixel groups that are used to determine phase difference information such as pixel pair 100 are sometimes referred to herein as phase detection pixels or depth-sensing pixels.

A phase difference signal may be calculated by comparing the output pixel signal of PD1 with that of PD2. For example, a phase difference signal for pixel pair 100 may be determined by subtracting the pixel signal output of PD1 from the pixel signal output of PD2 (e.g., by subtracting line 162 from line 160). For an object at a distance that is less than the focused object distance, the phase difference signal may be negative. For an object at a distance that is greater than the focused object distance, the phase difference signal may be positive. This information may be used to automatically adjust the image sensor optics to bring the object of interest into focus (e.g., by bringing the pixel signals into phase with one another).

Pixel pairs 100 may arranged in various ways. For example, as shown in FIG. 4A, Pixel 1 (referred to herein as P1) and Pixel 2 (referred to herein as P2) of pixel pair 100 may be oriented horizontally, parallel to the x-axis of FIG. 4A (e.g., may be located in the same row of a pixel array). In the example of FIG. 4B, P1 and P2 are oriented vertically, parallel to the y-axis of FIG. 4B (e.g., in the same column of a pixel array). In the example of FIG. 4C, P1 and P2 are arranged vertically and are configured to detect phase differences in the horizontal direction, such as from vertical edges (e.g., using an opaque light shielding layer such as metal mask 30). Various arrangements for phase detection pixels are described in detail in U.S. patent application Ser. No. 14/267,695, filed May 1, 2014, which is hereby incorporated by reference herein in its entirety.

A typical arrangement for phase detection pixels is shown in FIG. 5. The conventional pixel array 500 of FIG. 5 includes an array of image pixels 502. Phase detection pixel pairs 504 in pixel array 500 are arranged consecutively in a line. Pixel array 500 includes a color filter array. Pixels marked with an R include a red color filter, pixels marked with a G include a green color filter, and pixels marked with a B include a blue color filter. The pattern of color filters in image pixels 502 is a Bayer mosaic pattern which includes a repeating unit cell of two-by-two image pixels 502 having two green image pixels arranged on one diagonal and one red and one blue image pixel arranged on the other diagonal. As shown in FIG. 5, phase detection pixel pairs 504 are all formed with green color filter elements, which disrupts the Bayer mosaic pattern of pixel array 500.

Phase detection pixel pairs arranged consecutively in a line (as shown in FIG. 5) results in very informative phase detection pixel data. Cross-correlation between traces from the P1 and P2 pixels provide robust estimates of defocus, which can be superior to those resulting from more inferential approaches used to analyze data from patterns that do not support cross-correlation, such as those involving scattered, isolated phase detection pairs. However, when the color filter pattern is disrupted by a solid line of a single color, replacing phase detection pixel signals with interpolated image pixel values can be challenging. Optical crosstalk between image pixels 502 and 504 can also become problematic, as algorithms that correct for optical crosstalk in pixel arrays with a particular type of color filter pattern are less effective in correcting optical crosstalk when the color filter pattern is disrupted. To alleviate these problems, regular image pixels may be dispersed among the phase detection pixels. This additional image data makes it easier to replace phase detection pixel signals with interpolated image pixel values. However, it negatively affects the quality of the phase detection data.

To overcome these challenges, phase detection pixels may be arranged to optimize both the phase detection pixel data and the image pixel data. Illustrative phase detection pixel arrangements that optimize the phase detection data and the image data are shown in FIGS. 6-11. In the examples of FIGS. 6-11, pixels marked with an R include a red color filter, pixels marked with a G include a green color filter, and pixels marked with a B include a blue color filter. Dashed lines such as dashed line 102M may indicate regions that are covered by a single microlens such as microlens 102 of FIG. 2A.

The use of red, green, and blue color filters in FIGS. 6-11 is merely illustrative. If desired, the color filter patterns may include broadband filters. For example, each two-by-two unit of pixels may include one pixel having a broadband filter. In general, any suitable color filter pattern and any suitable type of color filter may be used in image sensor 14. The examples of FIGS. 6-11 are merely illustrative.

Figure 6:
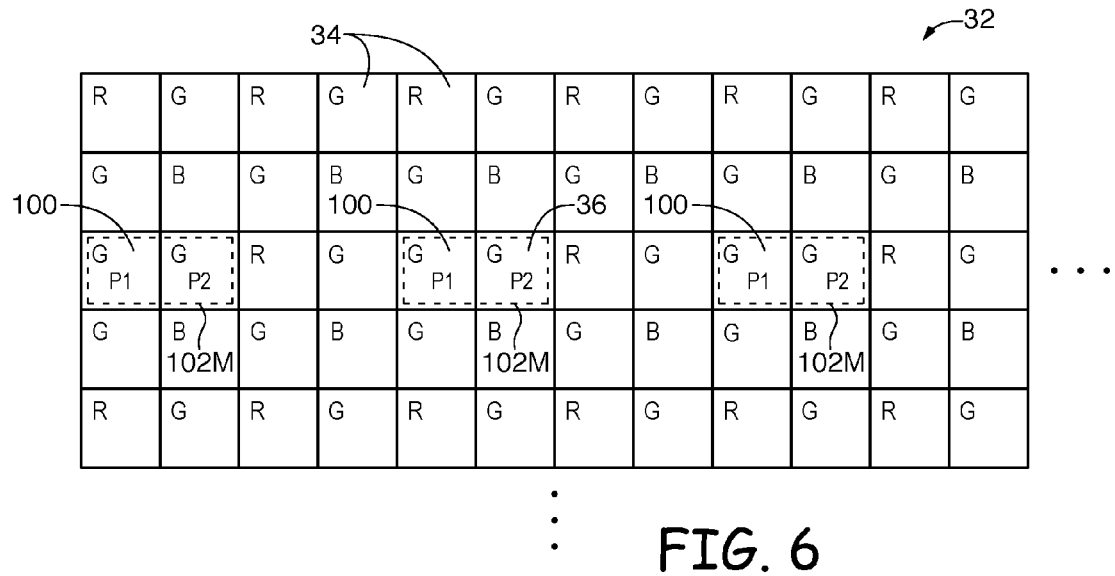
FIG. 6 is a top view of a pixel array having phase detection pixel pairs arranged in a dashed line with two image pixels in between the phase detection pixel pairs in accordance with an embodiment of the present invention.

As shown in FIG. 6, pixel array 32 may include image pixels 34 and phase detection pixels 36. Pixel array 32 may include an array of color filter elements such as red color filter elements (e.g., color filter material that passes red light while reflecting and/or absorbing other colors of light), blue color filter elements (e.g., color filter material that passes blue light while reflecting and/or absorbing other colors of light), green color filter elements (e.g., color filter material that passes green light while reflecting and/or absorbing other colors of light), yellow color filter elements (e.g., yellow color filter material that passes red and green light), clear color filter elements (e.g., transparent material that passes red, blue, and green light), broadband filter elements (e.g., filter material that passes two or more colors of light selected from the group that includes red light, blue light, and green light), and/or color filter elements of other colors (e.g., cyan, magenta, etc.).

In the example of FIG. 6, phase detection pixel pairs 100 are formed in a dashed line with two image pixels in between each pair. The phase detection pixel pairs 100 may all include color filter elements of the same color. As shown in FIG. 6, all of the phase detection pixel pairs 100 include a green color filter element. Using a green color filter element for phase detection pixel pairs 100 may be preferable because green light normally has a higher exposure than blue light or red light, and corresponds more closely with the luminance channel in the human visual system. Thus, the use of green color filter elements results in more accurate phase detection data. However, in certain embodiments the phase detection pixels may include a clear color filter, a broadband color filter, a red color filter, a blue color filter, or any other desired color filter. The image pixels in between each pair of phase detection pixel pairs will help the replacing of the phase detection pixel values with interpolated image pixel values during the image reconstruction process, as well as improving the correction of image pixels that are adjacent to PDAF pixels, which may be slightly perturbed by atypical optical crosstalk. In FIG. 6, two image pixels are shown in between each phase detection pixel pair 100. However, this example is purely illustrative. Each phase detection pixel pair may be separated by two image pixels, three image pixels, four image pixels, or more than four image pixels. More pixels in between each phase detection pixel pair will result in data that is easier to correct but has weaker focus performance.

The image pixels in between each phase detection pixel pair may include color filter elements to match the color filter pattern of image pixels 34. In the example of FIG. 6, image pixels 34 include color filter elements that form a Bayer pattern, and the image pixels in between the phase detection pixel pairs do not disrupt the Bayer pattern. The example of FIG. 6 in which the color filter pattern of pixel array 32 is a Bayer color filter pattern is merely illustrative. If desired, other suitable patterns of color filters may be used (e.g., pseudo-Bayer color filter patterns in which one or both of the green color filters in each two-by-two unit is replaced with a different type of filter such as a broadband filter, other suitable color filter patterns, etc.). Arrangements in which the color filter pattern of pixel array 32 is a Bayer color filter pattern are sometimes described herein as an example.

In the example of FIG. 6, the phase detection pixel pairs are arranged in a row. However, this example is purely illustrative and the phase detection pixel pairs may also be arranged in a column or a combination of rows and columns.

Figure 7:
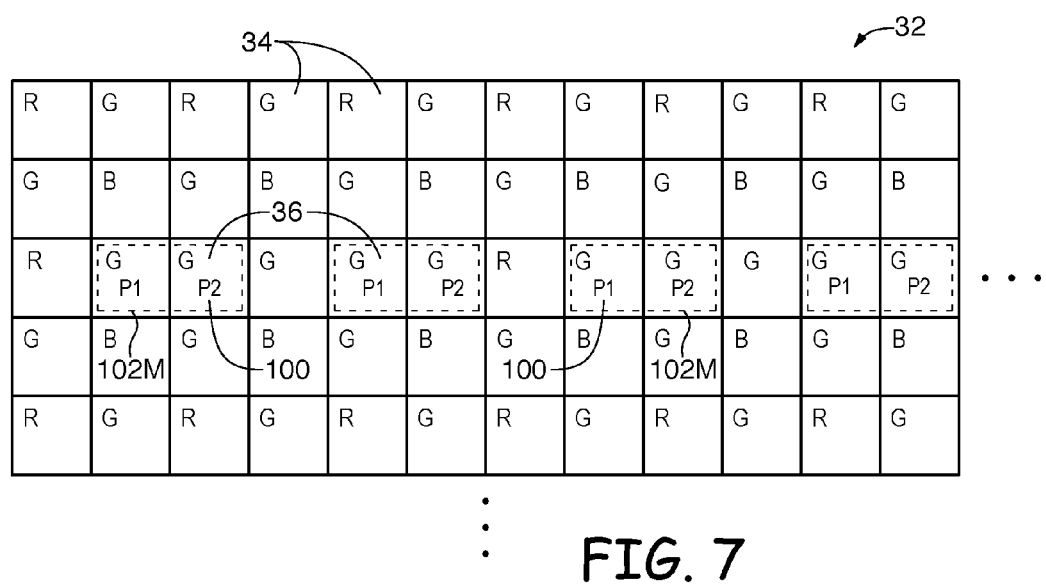
FIG. 7 is a top view of a pixel array having phase detection pixel pairs arranged in a dashed line with a single image pixel in between the phase detection pixel pairs in accordance with an embodiment of the present invention.

In the example of FIG. 7, phase detection pixel pairs 100 are arranged in a dashed line with a single image pixel in between each phase detection pixel pair. As with the example in FIG. 6, each phase detection pixel includes a green color filter element. However, contrary to FIG. 6, phase detection pixel pairs 100 are separated by only one intervening image pixel. The image pixels in between each phase detection pixel pair may include color filter elements that match the color filter pattern of image pixels 34. In the example of FIG. 7, image pixels 34 include color filter elements that form a Bayer pattern, and the image pixels in between the phase detection pixel pairs do not disrupt the Bayer pattern. The embodiment of FIG. 7 may provide the optimal layout for the phase detection pixel pairs. A single image pixel in between the phase detection pixel pairs results in enough image pixel data for accurate reconstruction while keeping the phase detection pixel pairs close enough together for accurate phase detection data.

In the example of FIG. 7, the phase detection pixel pairs are arranged in a row. However, this example is purely illustrative and the phase detection pixel pairs may also be arranged in a column or a combination of rows and columns.

Figures 8, 9:
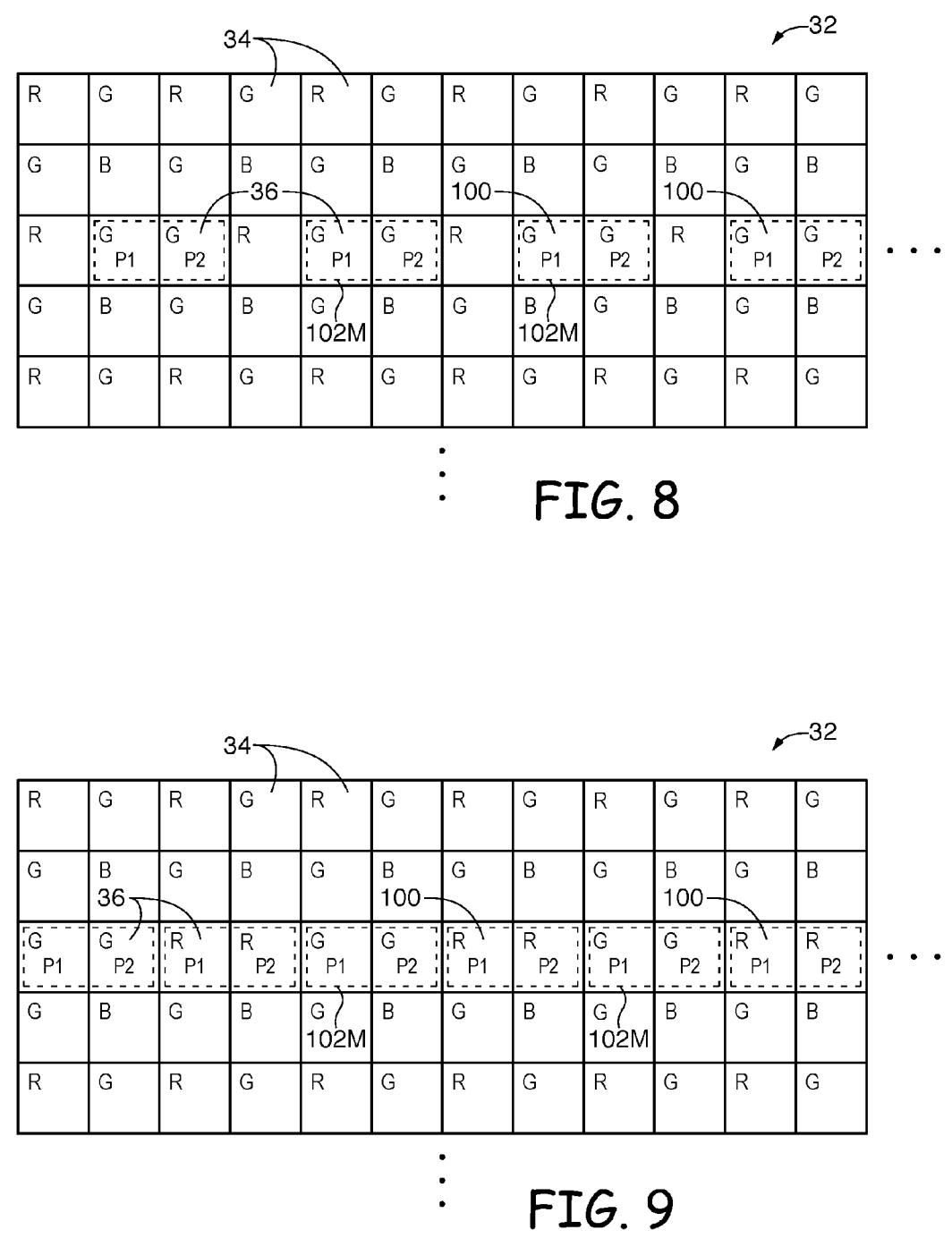

In the example of FIG. 8, phase detection pixel pairs 100 are arranged in a dashed line with a single image pixel in between each phase detection pixel pair. As with the example in FIG. 7, each phase detection pixel has a green color filter element. However, instead of matching the underlying color filter pattern of the image pixels (e.g., FIGS. 6 and 7), the image pixels in between each phase detection pixel pair may all have color filter elements of the same color. In certain embodiments, the image pixels in between each phase detection pixel pair may all have color filter elements that are the same color as the other color that would normally be present in that row of the color filter array. For example, in the embodiment shown in FIG. 8, the row containing the phase detection pixel pairs would normally contain red and green color filter elements according to the color pattern. Therefore, the image pixels in between each phase detection pixel pair all have red color filter elements. This example is purely illustrative, and the image pixels in between each phase detection pixel pair may have, for example, blue color filter elements or color filter elements of any desired color.

The average value for each pair of green phase detection pixel pairs is close to the value of an ordinary green pixel. Since the phase detection pixels all include green color filter elements, the phase detection pixel pairs may provide sufficient green sampling. Red color filter elements, therefore, may be used on the intervening image pixels to obtain more red sampling data in the phase detection row. Alternatively, blue color filter elements or color filter elements of another desired color may be used on the intervening image pixels.

In the example of FIG. 8, the phase detection pixel pairs are arranged in a row. However, this example is purely illustrative and the phase detection pixel pairs may also be arranged in a column or a combination of rows and columns.

In the example of FIGS. 9, P1 and P2 of a phase detection pixel pair 100 have the same color (e.g., red or green), and the pixel pairs 100 are arranged consecutively in a line (e.g., a line segment that includes two or more adjacent pixel pairs 100). However, unlike the conventional arrangement of FIG. 5, the color of pixel pairs 100 in the line changes from one pair to the next pair. For example, a pair of green phase detection pixels 36 may be interposed between first and second pairs of red phase detection pixels 36. Essentially, this arrangement consists of two dashed line patterns, one red and one green in this example, which are interspersed with one another. Because the average of the P1 and P2 pixels for a given color is close to the value an image pixel of that color would have had, image values at the positions of the PDAF pixels can be quite accurately estimated.

In the example of FIG. 9, the phase detection pixel pairs are arranged in a row. However, this example is purely illustrative and the phase detection pixel pairs may also be arranged in a column or a combination of rows and columns.

Figure 10:
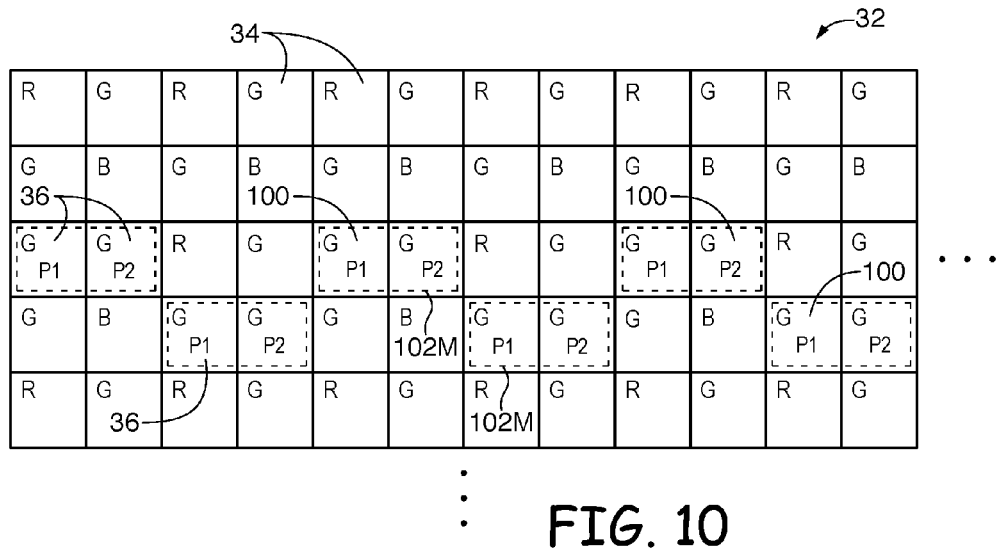
FIG. 10 is a top view of a pixel array having phase detection pixel pairs arranged in two adjacent lines with two image pixels in between the phase detection pixel pairs in accordance with an embodiment of the present invention.

In the example of FIG. 10, the phase detection pixels 36 are all the same color but are separated into different rows of pixel array 32. The phase detection pixels may all include a green color filter element. In one example, a first row of pixels may include one or more phase detection pixel pairs 100 arranged in a dashed line and a second row of pixels may include one or more phase detection pixel pairs 100 arranged in a dashed line. The phase detection pixel pairs in each row may be staggered such that no phase detection pixel pair directly overlaps another phase detection pixel pair. The image pixels in between each phase detection pixel pair may include color filter elements to match the color filter pattern of image pixels 34. In the example of FIG. 10, image pixels 34 include color filter elements that form a Bayer pattern, and the image pixels in between the phase detection pixel pairs do not disrupt the Bayer pattern. In alternate embodiments, the image pixels in between each phase detection pixel pair may not match the underlying color filter pattern. These embodiments may, for example, result in obtaining more red and blue sampling data in the phase detection rows.

The two rows with phase detection pixels may be adjacent. In alternate embodiments, the two rows with phase detection pixels may be separated by two rows, three rows, four rows, or more than four rows. The arrangement of the pattern of FIG. 10 may result in less visually obvious artifacts than the arrangement of FIG. 5.

In the example of FIG. 10, the phase detection pixel pairs are arranged in rows. However, this example is purely illustrative and the phase detection pixel pairs may also be arranged in columns or a combination of rows and columns.

Figure 11:
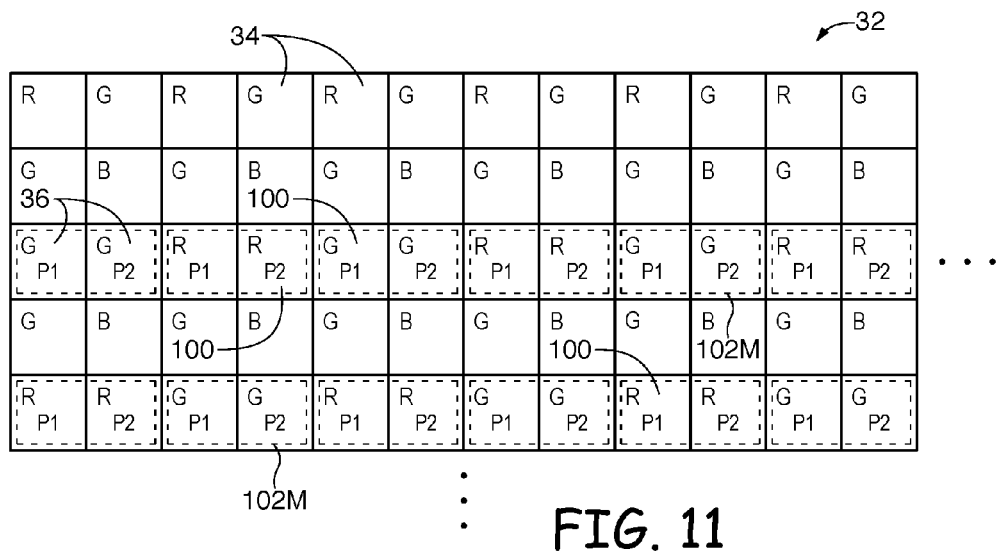
FIG. 11 is a top view of a pixel array having a line of image pixels in between two lines of phase detection pixel pairs in accordance with an embodiment of the present invention.

In the example of FIG. 11, there are two rows of phase detection pixel pairs 100 where each pair alternates color (e.g., FIG. 9). For example, in each row, a pair of green phase detection pixels 36 may be interposed between first and second pairs of red phase detection pixels 36. Alternating pairs of green phase detection pixels with pairs of red phase detection pixels in this way may facilitate the image reconstruction process when phase detection pixel values are replaced with interpolated image pixel values. The rows of phase detection pixels in FIG. 11 are separated by a single row of image pixels. However, the rows of phase detection pixels may be separated by two rows, three rows, four rows, or more than four rows.

The colors of the phase detection pixel pairs may be staggered such that a red phase detection pixel pair is always positioned above a green phase detection pixel pair and a green phase detection pixel pair is always positioned above a red phase detection pixel pair. In this way, the phase detection pixel pairs will provide data more similar to the underlying color filter pattern.

Various embodiments have been described illustrating an image sensor with phase detection pixels. In various embodiments of the invention, an image sensor may include a pixel array. The pixel array may include a plurality of image pixels that gather image data and a plurality of phase detection pixels that gather phase information. The phase detection pixels may be arranged in pairs that include first and second phase detection pixels with different angular responses. The pairs of phase detection pixels may be arranged in interrupted lines. The pixel array may also include a color filter array. Each phase detection pixel may include a respective color filter element of the same color.

The interrupted lines may include at least one image pixel interposed between each pair of phase detection pixels. The interrupted lines may include only one image pixel interposed between each pair of phase detection pixels. The color filter array may include a plurality of color filter elements formed over a plurality of image pixels, with the color filter elements arranged according to a color pattern such as the Bayer color pattern. Each image pixel in the interrupted lines may include a respective color filter element that matches the color pattern. Alternatively, each image pixel in the interrupted lines may include a respective color filter element of the same color. The color filter elements of the image pixels in the interrupted line may be the same color as the color filter elements of the phase detection pixels or a different color than the color filter elements of the phase detection pixels. The interrupted lines may include a first interrupted line that is directly adjacent to a second interrupted line. The interrupted lines may include a first interrupted line that is separated from a second interrupted line by a line of image pixels.

Each pair of phase detection pixels may be covered by a single microlens. Each microlens may have first and second orthogonal dimensions. The first dimension may be about twice as long as the second dimension.

In various embodiments of the invention, an image sensor may have a pixel array. The pixel array may include a plurality of image pixels that gather image data and a plurality of phase detection pixels that gather phase information. The phase detection pixels may be arranged into pairs that include first and second phase detection pixels with different angular responses. The pairs of phase detection pixels may be arranged in dashed lines. The pixel array may include a color filter array that has a plurality of color filter elements formed over the plurality of image pixels. The plurality of color filter elements may be arranged in a pattern. Each phase detection pixel may include a respective green color filter element.

The dashed lines may include only one image pixel in between each pair of phase detection pixels. Each of the image pixels in the dashed lines may have a red color filter element. Each of the image pixels in the dashed lines may have a color filter element that matches the color pattern. The image sensor may include an additional plurality of phase detection pixels. Each of the additional plurality of phase detection pixels may include a respective red color filter element. A single pair of phase detection pixels from the additional plurality of phase detection pixels may be interposed between each pair of phase detection pixels from the plurality of phase detection pixels.

In various embodiments of the invention, an imaging device may include an image pixel array. The image pixel array may include a plurality of phase detection pixel pairs that gather phase information. Each phase detection pixel pair may include first and second photosensitive regions with different angular responses. The first and second photosensitive regions may be covered by a single microlens. The phase detection pixel pairs may be arranged in an interrupted line. The pixel array may include a plurality of image pixels, with a single image pixel interposed between each phase detection pixel pair. Each of the phase detection pixel pairs may include a green color filter element.

The foregoing is merely illustrative of the principles of this invention and various modifications can be made by those skilled in the art without departing from the scope and spirit of the invention.

What is claimed is:

1. An image sensor having an image pixel array with a plurality of rows and columns, wherein the image pixel array comprises:
a plurality of phase detection pixel pairs that gather phase information, wherein each of the phase detection pixel pairs comprises first and second photosensitive regions, wherein the first and second photosensitive regions are covered by a single microlens, wherein each microlens has a length, a width, and a height, wherein the length is longer than the width, and wherein the phase detection pixel pairs are arranged in a dashed line in a single row of the plurality of rows; and
a plurality of image pixels that each have a symmetric response to incident light, wherein the dashed line comprises at least one image pixel interposed between each phase detection pixel pair.

2. The image sensor defined in claim 1, wherein each phase detection pixel in the plurality of phase detection pixel pairs is a square pixel.

3. The image sensor defined in claim 1, wherein the length of each microlens is at least twice as long as the width of each microlens.

4. The image sensor defined in claim 1, wherein each of the phase detection pixel pairs comprises first and second color filter elements positioned over the first and second photosensitive regions.

5. The image sensor defined in claim 4, wherein the first and second color filter elements in each phase detection pixel pair have the same transmission characteristics, and wherein the first and second color filter elements in each phase detection pixel pair comprise color filter elements selected from the group consisting of: green color filter elements, clear color filter elements, and broadband color filter elements.

6. The image sensor defined in claim 5, wherein each image pixel in the dashed line includes a respective color filter element, and wherein the color filter elements of each image pixel in the dashed line have the same transmission characteristics.

7. The image sensor defined in claim 6, wherein the color filter elements of each image pixel in the dashed line comprise color filter elements selected from the group consisting of: red color filter elements and blue color filter elements.

8. An image sensor having an image pixel array with a plurality of rows and columns, wherein the image pixel array comprises:
a plurality of phase detection pixel pairs that gather phase information, wherein each of the phase detection pixel pairs comprises first and second photosensitive regions;
a plurality of microlenses, wherein each microlens of the plurality of microlenses covers respective first and second photosensitive regions of a respective phase detection pixel pair of the plurality of phase detection pixel pairs, wherein each microlens of the plurality of microlenses has a respective length, a respective width, and a respective height, wherein the respective length is the longest distance between any two points of the respective microlens in a first direction, the respective width is the longest distance between any two points of the respective microlens in a second direction that is orthogonal to the first direction, and the respective height is the longest distance between any two points of the microlens in a third direction that is orthogonal to the first and second directions, wherein the respective length is longer than the respective width, and wherein the phase detection pixel pairs are arranged in a dashed line in a single row of the plurality of rows; and
a plurality of image pixels that each have a symmetric response to incident light, wherein the dashed line comprises at least one image pixel interposed between each phase detection pixel pair.

9. The image sensor defined in claim 8, wherein each phase detection pixel in the plurality of phase detection pixel pairs is a square pixel.

10. The image sensor defined in claim 8, wherein the respective length of each microlens is at least twice as long as the respective width of each microlens.

11. An image sensor having a pixel array, wherein the pixel array comprises:
a plurality of image pixels that gather image data, wherein each image pixel of the plurality of image pixels has a respective photosensitive area;
a plurality of phase detection pixels that gather phase information, wherein each phase detection pixel of the plurality of phase detection pixels has a respective photosensitive area, wherein the phase detection pixels are arranged in pairs that include first and second phase detection pixels with different angular responses, wherein the first and second phase detection pixels are covered by a single microlens, wherein the microlens for each pair of phase detection pixels has a length, a width, and a height, wherein the length is longer than the width, wherein the pairs of phase detection pixels and image pixels are arranged in a single row in an interrupted line, wherein the interrupted line includes a plurality of pairs of phase detection pixels and at least one image pixel interposed between each pair of phase detection pixels, and wherein the photosensitive area of each image pixel of the plurality of image pixels is the same size as the photosensitive area of each phase detection pixel of the plurality of phase detection pixels; and
a color filter array, wherein each phase detection pixel includes a respective color filter element, and wherein the color filter elements of the phase detection pixels are all the same color.

12. The image sensor defined in claim 11, wherein each phase detection pixel in the plurality of phase detection pixel pairs is a square pixel.

13. The image sensor defined in claim 11, wherein the length of each microlens is at least twice as long as the width of each microlens.

14. The image sensor defined in claim 11, wherein the at least one image pixel interposed between each pair of phase detection pixels comprises two image pixels interposed between each pair of phase detection pixels, and wherein the two image pixels are the only image pixels interposed between each pair of phase detection pixels.

15. The image sensor defined in claim 11, wherein each of the plurality of image pixels has a symmetric response to incident light.

16. The image sensor defined in claim 11, wherein the at least one image pixel interposed between each pair of phase detection pixels comprises a single image pixel interposed between each pair of phase detection pixels, and wherein the single image pixel is the only image pixel interposed between each pair of phase detection pixels.

17. The image sensor defined in claim 16, wherein the color filter array comprises a plurality of color filter elements formed over the plurality of image pixels, and wherein the plurality of color filter elements are arranged according to a color pattern.

18. The image sensor defined in claim 17, wherein each of the image pixels in the interrupted line includes a respective color filter element that matches the color pattern.

19. The image sensor defined in claim 18, wherein the color pattern is a Bayer color pattern.

\* \* \* \* \*